United States Patent
Trochut et al.

(10) Patent No.: US 9,671,473 B2
(45) Date of Patent: Jun. 6, 2017

(54) INTEGRATED HALL EFFECT SENSOR WITH A BIASED BURIED ELECTRODE

(71) Applicant: STMicroelectronics SA, Montrouge (FR)

(72) Inventors: Severin Trochut, Gilly (FR); Eric Remond, Francin (FR)

(73) Assignee: STMicroelectronics SA, Montrouge (FR)

( * ) Notice: Subject to any disclaimer, the term of this patent is extended or adjusted under 35 U.S.C. 154(b) by 90 days.

(21) Appl. No.: 14/286,431

(22) Filed: May 23, 2014

(65) Prior Publication Data

US 2014/0354276 A1 Dec. 4, 2014

(30) Foreign Application Priority Data

May 30, 2013 (FR) ..................................... 13 54922

(51) Int. Cl.
  *G01R 33/07* (2006.01)
  *H01L 43/04* (2006.01)
  *H01L 43/06* (2006.01)

(52) U.S. Cl.
  CPC ............ *G01R 33/072* (2013.01); *H01L 43/04* (2013.01); *H01L 43/065* (2013.01)

(58) Field of Classification Search
  CPC ...... G01R 33/072; H01L 43/04; H01L 43/065
  USPC ................................................. 324/252, 251
  See application file for complete search history.

(56) References Cited

U.S. PATENT DOCUMENTS

| | | | | |
|---|---|---|---|---|
| 2,862,184 | A * | 11/1958 | Longini | G01R 21/133 257/422 |
| 4,577,250 | A * | 3/1986 | Sato | G11B 5/372 360/112 |
| 4,987,467 | A * | 1/1991 | Popovic | G01R 15/202 257/421 |
| 2003/0094943 | A1* | 5/2003 | Ashley | G01R 33/07 324/251 |
| 2009/0206424 | A1* | 8/2009 | Kilian | G01R 33/07 257/421 |
| 2010/0019332 | A1 | 1/2010 | Taylor | |
| 2011/0133723 | A1* | 6/2011 | Forsyth | G01D 5/145 324/207.2 |

FOREIGN PATENT DOCUMENTS

JP          03070188 A *  3/1991  ............ H01L 43/06

OTHER PUBLICATIONS

English translation of JP 03070188.*
INPI Search Report and Written Opinion for FR 1354922 mailed Nov. 7, 2013 (6 pages).

* cited by examiner

*Primary Examiner* — Jay Patidar
(74) *Attorney, Agent, or Firm* — Gardere Wynne Sewell LLP

(57) ABSTRACT

The generation of a Hall voltage within a semiconductor film of an integrated Hall effect sensor uses the flow of a current within the semiconductor film when subjected to a magnetic field. The film is disposed on top of an insulating layer, referred to as buried layer, which is itself disposed on top of a carrier substrate containing a buried electrode that is situated under the insulating layer. A biasing voltage is applied to the buried electrode.

21 Claims, 3 Drawing Sheets

INTEGRATED HALL EFFECT SENSOR WITH A BIASED BURIED ELECTRODE

PRIORITY CLAIM

This application claims priority from French Application for Patent No. 1354922 filed May 30, 2013, the disclosure of which is incorporated by reference.

TECHNICAL FIELD

The invention relates to integrated circuits, notably Hall effect sensors integrated within such circuits, and more particularly, those fabricated using a technology of the FD SOI (Fully Depleted Silicon-On-Insulator) type.

BACKGROUND

When a current, referred to as "bias current", flows through a Hall effect sensor and the sensor is subjected to a magnetic field, the sensor generates a voltage, referred to as Hall voltage, in a direction orthogonal to those of the current and of the magnetic field.

Currently, Hall effect sensors exist that are fabricated using bulk silicon substrate technology ("bulk" technology) and that comprise a semiconductor region formed within the bulk substrate through which the bias current is designed to flow. However, the thickness of the semiconductor region is generally significant in such a technology, which is detrimental to the gain of such a sensor, in other words the ratio between the Hall voltage and the bias current. Furthermore, this thickness is subject to variations owing notably to the fabrication method typically used, which has a further negative impact on the real value of the gain.

SUMMARY

According to one embodiment, an integrated Hall effect sensor is provided having an improved sensitivity or gain.

According to one aspect, an integrated Hall effect sensor is provided formed within and on a region of a substrate of the silicon-on-insulator type, such a substrate of the SOI type comprising a semiconductor film disposed on top of an insulating layer, referred to as 'buried', itself disposed on top of a carrier substrate.

The integrated sensor furthermore comprises: a buried electrode disposed within the region (generally a semiconductor cavity) of the carrier substrate under the region of the buried insulating layer, first means coupled to a first area of the region of the film and configured for receiving a current, second means coupled to a second area of the region of the film and configured for delivering the current having passed through the region of the film, third means coupled to a third area of the region of the film and configured for delivering a Hall voltage, and biasing means configured for biasing the buried electrode.

Thus, the use of a technology of the SOI type, and in particular of the FD SOI type, in other words with a totally depleted substrate in which the semiconductor film is particularly thin, typically of the order of ten nanometers, allows a very well controlled, and hence virtually uniform, thickness of the semiconductor film to be obtained, the thickness being less than that of the equivalent semiconductor region formed using bulk-substrate technology. For this reason, since the physical thickness of the semiconductor film is reduced, the gain or sensitivity of the Hall effect sensor is increased since this gain varies proportionally to the inverse of the thickness of the film.

Furthermore, in combination with the use of such a technology, the fact that the buried electrode is biased allows the concentration of dopants within the semiconductor material of the film to be reduced so as to come close to the concentration of dopants within the intrinsic material. For this reason, the Hall constant is increased, which allows the gain of the sensor to be increased.

Moreover, the biasing of the buried electrode allows the current lines to be repelled towards the surface of the semiconductor film, and consequently the effective thickness of the channel region, within which the current flows through the Hall effect sensor, to be reduced, and reducing by a biasing effect the effective thickness of the region in which the current will flow allows the gain of the sensor to be increased.

This bias voltage notably depends on the type of cavity under the film of the sensor and must not exceed the voltage breakdown capability of the oxide and the diode, where used, between the cavity and the rest of the substrate-support, typically 10 volts in absolute value.

According to one embodiment, the initial concentration of dopants within the region of the semiconductor film in the absence of biasing of the buried electrode is greater than the concentration of dopants within the intrinsic semiconductor material, owing notably to the residual doping due to the formation of the buried electrode by implantation, and the concentration of dopants within the region of the semiconductor film in the presence of biasing of the buried electrode is in the range between the concentration within the intrinsic material and the initial concentration, and preferably equal to or in the neighbourhood of this concentration of the intrinsic material.

According to another aspect, an integrated circuit is provided comprising at least one sensor such as defined hereinbefore.

In addition, according to one embodiment, the integrated circuit can furthermore comprise: at least one component, for example a processor, a metallization coupled to the component, disposed in the neighborhood of the sensor, and designed to carry a current, for example the current absorbed by the processor, in such a manner as to generate a magnetic field within the sensor.

Determination means are then provided configured for determining the current flowing in the metallization.

This allows the value of the current, for example absorbed by the processor, to be very simply determined using the integrated Hall effect sensor and for example appropriate actions to then be applied.

According to another aspect, a method is provided for generating a Hall voltage within a semiconductor film, comprising: a flow of a current within the semiconductor film subjected to a magnetic field and disposed on top of an insulating layer, referred to as buried layer, itself disposed on top of a carrier substrate containing a buried electrode situated under the insulating layer, and a biasing of the buried electrode.

According to one embodiment, the initial concentration of dopants within the semiconductor film in the absence of biasing of the buried electrode is greater than the concentration of dopants within the intrinsic semiconductor material, and the buried electrode is biased with a bias voltage chosen so as to obtain a concentration of dopants within the semiconductor film in the range between the concentration within the intrinsic material and the initial concentration, preferably equal to or in the neighborhood of the concentration within the intrinsic material.

According to another aspect, a method is furthermore provided for determining a current flowing through a metallization disposed in the neighborhood of a semiconductor film, which method comprises: a measurement of the Hall voltage generated within the film by the generation method such as defined hereinabove, the magnetic field to which the film is subjected coming from the magnetic field generated by the flow of the current within the metallization, and a determination of the magnetic field and a determination of the current flowing within the metallization based on the value of the magnetic field.

BRIEF DESCRIPTION OF THE DRAWINGS

Other advantages and features of the invention will become apparent upon examining the detailed description of non-limiting embodiments and of their implementation, and the appended drawings in which.

DETAILED DESCRIPTION OF THE DRAWINGS

Figure 1:
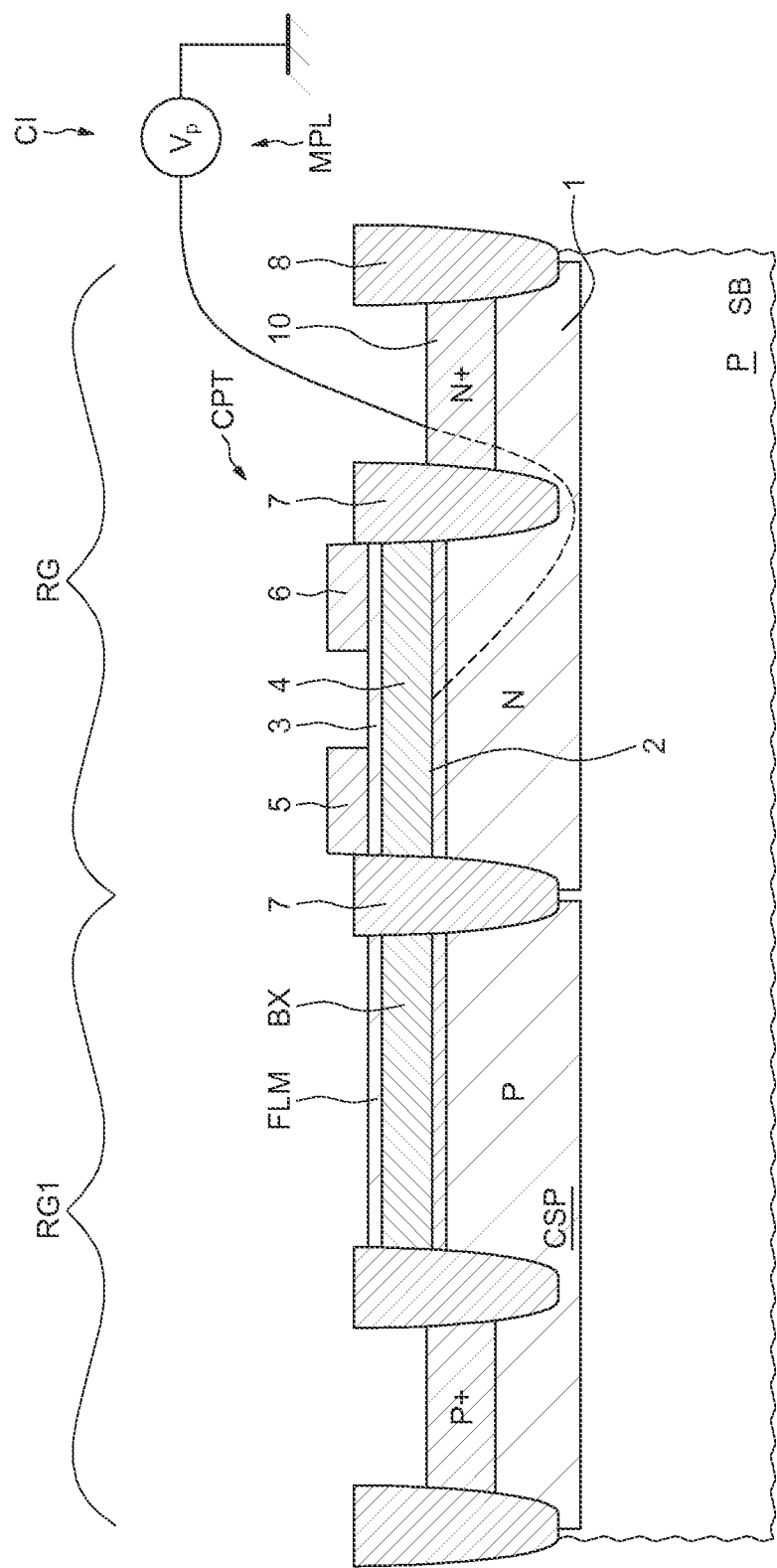
FIGS. 1 to 4 illustrate schematically various embodiments of the invention and their implementation.

In FIG. 1, the reference CI denotes an integrated circuit fabricated using an SOI technology, and more particularly using an FD SOI technology.

In an SOI technology, the substrate of the SOI type conventionally comprises a semiconductor film FLM disposed on top of a buried insulating region BX, (commonly denoted by those skilled in the art under the acronym BOX) itself disposed on top of a carrier substrate SB, for example made of silicon.

In a technology of the fully depleted silicon-on-insulator (FD SOI) type the film of silicon is particularly thin, for example of the order of ten nanometers, and is initially formed from intrinsic material, for example from intrinsic silicon having a doping of the order of $10^{10}$ atoms per cm$^3$.

The thickness of the buried insulating layer BX is typically of the order of 25 nm.

In one region RG of the FD SOI substrate, the integrated circuit CI comprises a Hall effect sensor CPT.

This sensor CPT comprises, in this embodiment, a region of semiconductor film 3 disposed on top of a buried insulating layer region 4 itself disposed on top of a region of the carrier substrate which here comprises a cavity region 1, for example of the N conductivity type, accommodated within an underlying substrate of the P type.

A buried electrode 2, commonly denoted by those skilled in the art by the term "ground plane", and generally formed by implantation of dopants, is disposed within the cavity region 1 under the insulating layer region 4. This buried layer is for example here also of the N type. However, generally, the concentration of dopants within the buried electrode 2 is greater than the concentration of dopants within the cavity region 1.

Two regions 5 and 6, in general epitaxially grown, are formed on top of the semiconductor film 3 in such a manner as to allow, as will be seen hereinafter, contacts to be made on the film in order to measure the Hall voltage generated.

The film region 3, the insulating layer region 4, the buried electrode 2 and the cavity region 1 situated under the insulating layer region 4, are isolated from the rest of the integrated circuit by an insulating region 7, for example insulating trenches.

Furthermore, in order to be able to bias the buried electrode 2, a contact well is provided outside of the insulating region 7 comprising a more highly doped region 10, for example with N+ doping, so as to allow a contact to be made onto the cavity region 1. This contact well is bounded by the insulating region 7 and by another insulating region 8.

Biasing means MPL here comprising a source of bias voltage Vp will allow the buried electrode 2 to be biased via the contact well 10 with the bias voltage Vp.

As illustrated in FIG. 1, the integrated circuit can also comprise, in another region RG1 of the integrated circuit, a cavity region CSP of the P type, biasable via a contact well comprising a P+ region, and situated under the insulating layer BX supporting the semiconductor film FLM. In this other region RG1 of the integrated circuit, other components can thus be formed, such as for example transistors.

Figure 2:
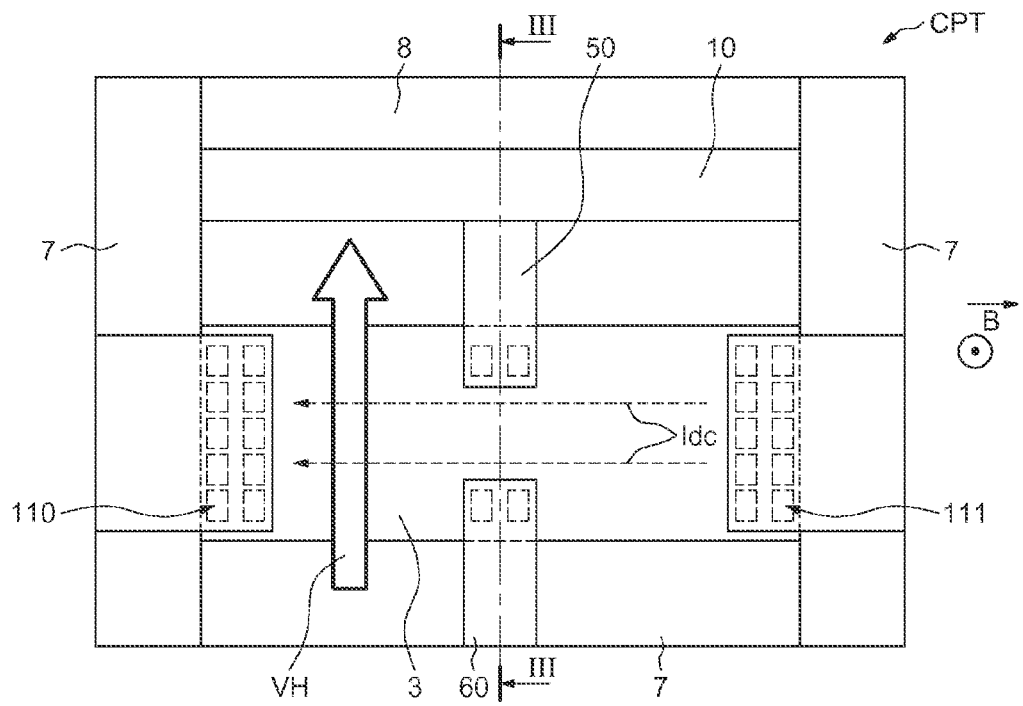
Figure 3:
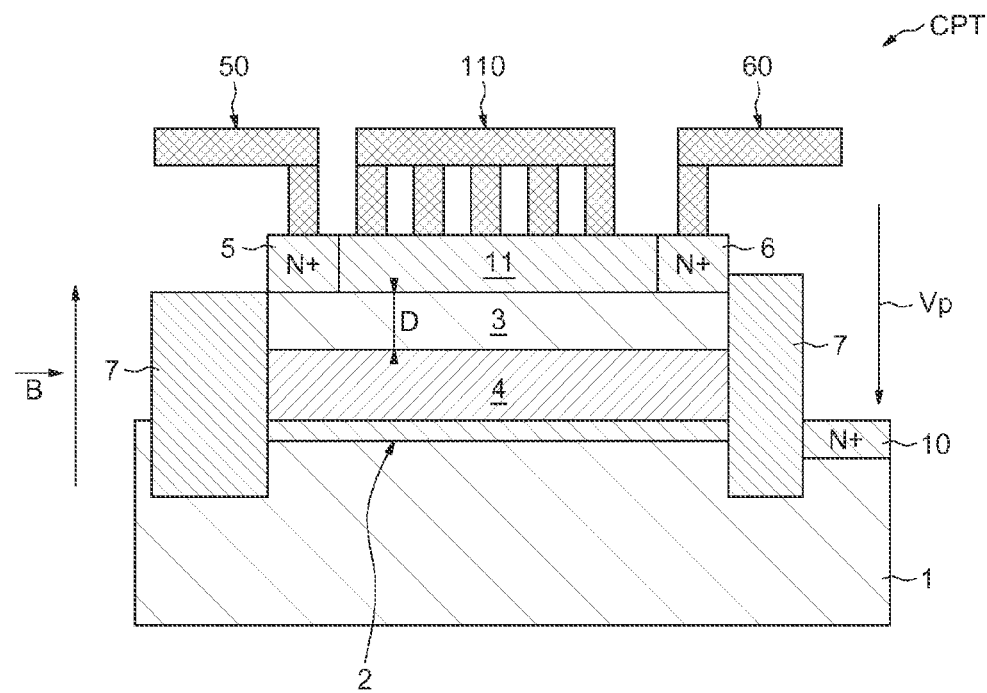

FIG. 2 illustrates a schematic top view of the sensor CPT, whereas FIG. 3 is a cross-sectional view according to the line III-III in FIG. 2.

In these figures can be seen the semiconductor film region 3 having a physical thickness D, disposed on top of the insulating layer region 4 itself situated on top of the cavity region 1 comprising the buried electrode 2 capable of being biased via the contact region 10 by the bias voltage Vp.

At two ends, here the longitudinal ends, of the film 3, the sensor CPT also comprises two regions 11, in general epitaxially grown, for example N+ doped.

The sensor CPT furthermore comprises first means 111 coupled to a first area, in this case a first longitudinal end, of the region of the film 3 and configured for receiving a bias current Idc, and second means 110 coupled to a second area, in this case the opposite longitudinal end, of the region of the film 3, and configured for delivering the current having passed through the region of the film 3.

As illustrated notably in FIG. 3, the second means 110 comprise a metallization, situated for example in the metal level 1 of the interconnection part (commonly denoted by those skilled in the art with the acronym BEOL for "Back End Of Lines"), and coming into contact with the N+ doped region 11 by means of bump contacts, more simply denoted by "metal contacts", for example made of tungsten. The first means 111 have a metal structure analogous to the second means 110.

As illustrated in FIG. 2, when the film 3 has the bias current Idc passing through it and is subjected to the magnetic field B orthogonal to the direction of the bias current, a voltage, referred to as "Hall voltage", VH is created orthogonal both to the lines of the bias current and to the magnetic field. The voltage VH is therefore, in this case, generated between the two lateral ends of the film 3.

Accordingly, the sensor CPT comprises third means coupled to a third area, in this case the two lateral ends of the film 3, via the two N+ doped areas 5 and 6 configured for delivering the Hall voltage VH. These third means notably comprise metallizations 50 and 60 situated in the metal level 1 and in electrical contact with the areas 5 and 6 via metal contacts.

The Hall voltage VH is given by the formula (I) hereinbelow $$VH = \frac{Rh \times Idc \times B}{D} \qquad (I)$$

in which:

Rh denotes the Hall constant,

Idc denotes the intensity of the bias current flowing through the semiconductor film 3, B denotes the intensity of the magnetic field, and D denotes the effective thickness of the semiconductor region through which the current lines pass.

The Hall constant Rh itself is given by the formula (II) hereinbelow $$Rh = r \frac{1}{q \times p} \frac{1-b}{(1+b)} \quad (II)$$

in which:

q denotes the elementary charge on an electron, p, which is assumed here to be equal to n, denotes the carrier density (holes and electrons), b denotes the ratio between the mobility of the electrons and the mobility of the holes, and r is a constant.

The carrier density of the intrinsic material of the film 3, in this case the silicon, is equal to $10^{10}$ atoms per $cm^3$.

Furthermore, the buried electrode 2 is generally obtained by implantation. For this reason, after this implantation, the doping tail for this buried electrode leads to a carrier density in the film 3 of the order of $10^{15}$ atoms per $cm^3$.

The bias voltage Vp has the effect of modifying n and p in the film 3 so as to reduce their concentration and bring the latter to the level of that of intrinsic silicon, in other words of the order of $1 \cdot 10^{10}$ atoms per $cm^3$.

For this reason, the formula (II) means that the decrease in the concentration p has the effect of increasing the Hall constant Rh.

The formula (I) then means that the increase in this Hall constant has the effect of increasing the ratio VH/Idc, in other words the gain or the sensitivity of the sensor.

Furthermore, the bias voltage Vp also has the effect of repelling the current lines towards the upper face of the semiconductor film 3 and hence as a consequence of reducing the "effective" thickness of the region of the film 3 within which the current lines Idc effectively pass. Consequently, this thickness takes a value which is less than the physical value D of the film 3, which therefore has the effect, by virtue of the formula (I), of further increasing the gain of the sensor CPT.

By way of example, going from a bulk-substrate technology to an FD SOI 28 nanometer technology allows, without biasing the cavity, a factor of the order of 1000 to be gained on the gain of the sensor owing principally to the reduction in thickness of the sensor. By biasing the buried electrode, an additional factor in the range between 1.5 and 10 may be gained.

The applications of such a Hall effect sensor are manifold, such as for example the measurement of the electromagnetic field in medical imaging equipment of the MRI type, or for example the determination of the value of the current absorbed by a component, for example a processor, or else a range of activity of an integrated circuit, in such a manner as to be able to monitor for example the activity of the processor.

Figure 4:
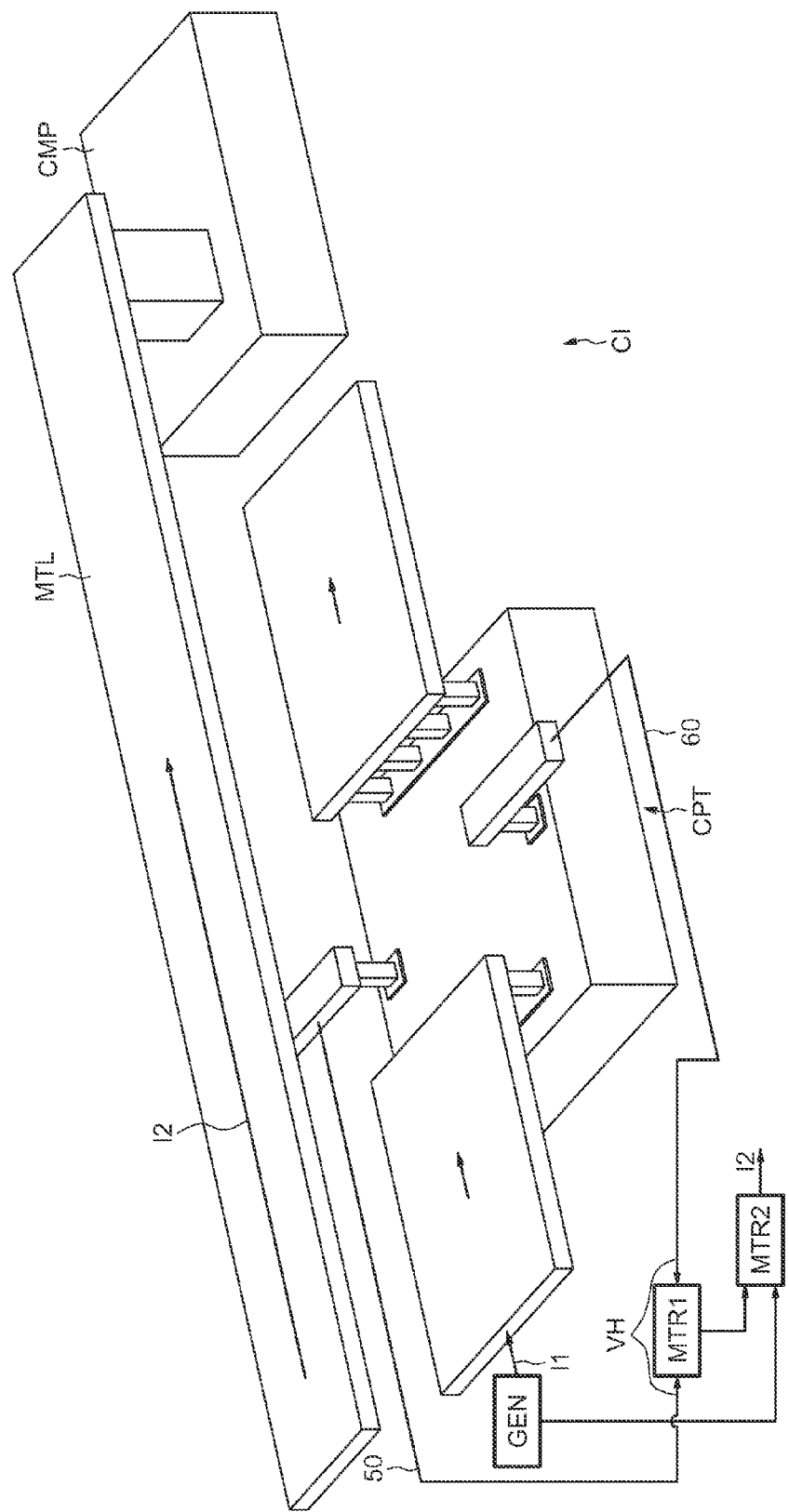

For this purpose, as illustrated in FIG. 4, in order to be able to measure the current I2 absorbed by a component CMP, for example a processor, so as to be able notably to monitor its activity, a metallization MTL connected to the component CMP is disposed in the neighborhood of the sensor CPT. This metallization MTL will have the current I2 flowing through it and, consequently, will generate a magnetic field (Biot-Savart law) in the sensor CPT.

When the bias current I1 generated by the generation means GEN flows through the sensor CPT, it will generate the Hall voltage VH, which will be measured by the means MTR1, in the metallizations 50 and 60. The means MTR1 will therefore deduce from this (formula (I)) the value of the magnetic field B generated by the current I2, and the means MTR2 will then be able to calculate the current I2 based on the value of the magnetic field B determined, by using the Biot-Savart equation.

The means MTR1 and MTR2 can for example comprise an analog-to-digital converter whose output is connected to logic circuits or to an application module within a microcontroller, or else may comprise purely analog elements based on amplifiers/comparators.

What is claimed is:

1. A method for generating a Hall voltage within a semiconductor film disposed on top of an insulating layer which is disposed on top of a carrier semiconductor substrate containing a buried semiconductor electrode situated under the insulating layer, comprising:
    flowing a current within the semiconductor film that is subjected to a magnetic field, and
    biasing the buried semiconductor electrode with a bias voltage by applying the bias voltage to the carrier semiconductor substrate which is in electrical contact with the buried semiconductor electrode.

2. The method according to claim 1, wherein the semiconductor film includes a dopant concentration level greater than for an intrinsic semiconductor material, and wherein biasing comprises biasing the buried semiconductor electrode with a bias voltage chosen so as to reduce the dopant concentration level.

3. The method according to claim 2, wherein biasing comprises biasing the buried semiconductor electrode with a bias voltage chosen so as to reduce the dopant concentration level to substantially equal a dopant concentration level of intrinsic semiconductor material.

4. The method according to claim 1, wherein the buried semiconductor electrode is a doped region of the carrier semiconductor substrate situated under the insulating layer.

5. A method for generating a Hall voltage within a semiconductor film disposed on top of an insulating layer which is disposed on top of a carrier semiconductor substrate containing a buried semiconductor electrode situated under the insulating layer, comprising:
    flowing a current within the semiconductor film that is subjected to a magnetic field;
    biasing the buried semiconductor electrode with a bias voltage;
    measurement of the Hall voltage generated within the semiconductor film;
    determining a current flowing through a metallization disposed near the semiconductor film;
    wherein the magnetic field to which the semiconductor film is subjected arises from the magnetic field generated by the flow of the current within the metallization; and
    determining the magnetic field and the current flowing through the metallization based on the value of the magnetic field.

6. The method according to claim 5, wherein biasing the buried semiconductor electrode comprises applying the bias voltage to the carrier semiconductor substrate which is in electrical contact with the buried semiconductor electrode.

7. The method according to claim 5, wherein the semiconductor film includes a dopant concentration level greater than for an intrinsic semiconductor material, and wherein biasing comprises biasing the buried semiconductor electrode with a bias voltage chosen so as to reduce the dopant concentration level.

8. The method according to claim 7, wherein biasing comprises biasing the buried semiconductor electrode with a bias voltage chosen so as to reduce the dopant concentration level to substantially equal a dopant concentration level of intrinsic semiconductor material.

9. The method according to claim 5, wherein the buried semiconductor electrode is a doped region of the carrier semiconductor substrate situated under the insulating layer.

10. An integrated Hall effect sensor, comprising:
a substrate of the silicon-on-insulator type comprising a semiconductor film disposed on top of an insulating layer which is disposed on top of a carrier semiconductor substrate;
a buried semiconductor electrode disposed in a region of the carrier semiconductor substrate under the region of the insulating layer;
a first metal connection coupled to a first area of the semiconductor film and configured to receive a current;
a second metal connection coupled to a second area of the semiconductor film and configured to deliver the current having passed through the semiconductor film;
a third metal connection coupled to a third area of the semiconductor film and configured to deliver a Hall voltage; and
a biasing connection configured to apply a biasing voltage to the carrier semiconductor substrate for biasing the buried semiconductor electrode.

11. The sensor according to claim 10, wherein the semiconductor film has a first level of dopant concentration in the absence of biasing of the buried electrode that is greater than a second level of dopant concentration of intrinsic semiconductor material.

12. The sensor according to claim 11, wherein the semiconductor film has third level of dopant concentration in the presence of biasing of the buried electrode that is between the first dopant concentration and the second dopant concentration.

13. The sensor according to claim 12, wherein the third dopant concentration of the semiconductor film in the presence of biasing of the buried electrode is substantially equal to the second dopant concentration of intrinsic semiconductor material.

14. The sensor according to claim 10, wherein the substrate is a fully-depleted substrate on insulator.

15. The sensor according to claim 10 as fabricated as an integrated circuit.

16. The sensor according to claim 15, further comprising:
at least one integrated circuit component;
a metallization coupled to the integrated circuit component disposed adjacent the sensor and configured to carry a current in such a manner as to generate a magnetic field within the sensor; and
a determination circuit configured to determine the current flowing within the metallization.

17. The sensor according to claim 10, wherein the buried semiconductor electrode is a doped region of the carrier semiconductor substrate.

18. An apparatus, comprising:
a supporting substrate including:
a first region of semiconductor material of a first conductivity type and a second region of semiconductor material of a second conductivity type, the first and second regions isolated from each other by an isolation region;
a Hall effect sensor formed over the first region, said sensor comprising:
a buried electrode in contact with the first region;
an insulating layer formed over the buried electrode;
a semiconductor film formed over the insulating layer; and
first and second electrical contacts disposed on the semiconductor film; and
a biasing circuit comprising an electrical contact made with the first region and configured to receive a biasing voltage for application to said buried electrode.

19. The apparatus of claim 18, further comprising: an integrated structure formed over the second region, said structure comprising:
an additional buried electrode in contact with the second region;
an additional insulating layer formed over the additional buried electrode; and
an additional semiconductor film formed over the additional insulating layer; and
an additional biasing circuit comprising an additional electrical contact made with the second region.

20. The apparatus of claim 19, wherein the additional semiconductor film supports formation of integrated circuits.

21. The apparatus of claim 18, wherein the buried electrode is a doped region of the first region of semiconductor material under the insulating layer.

* * * * *